United States Patent
Yi et al.

(10) Patent No.: US 10,483,461 B2
(45) Date of Patent: Nov. 19, 2019

(54) EMBEDDED MRAM IN INTERCONNECTS AND METHOD FOR PRODUCING THE SAME

(71) Applicant: GLOBALFOUNDRIES Singapore Pte. Ltd., Singapore (SG)

(72) Inventors: Wanbing Yi, Singapore (SG); Curtis Chun-I Hsieh, Singapore (SG); Yi Jiang, Singapore (SG); Bharat Bhushan, Singapore (SG); Mahesh Bhatkar, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/957,506

(22) Filed: Apr. 19, 2018

(65) Prior Publication Data

US 2019/0326509 A1    Oct. 24, 2019

(51) Int. Cl.
| | |
|---|---|
| *H01L 27/22* | (2006.01) |
| *H01L 43/12* | (2006.01) |
| *H01L 23/522* | (2006.01) |
| *H01L 43/02* | (2006.01) |
| *H01L 43/08* | (2006.01) |

(52) U.S. Cl.
CPC .......... *H01L 43/12* (2013.01); *H01L 23/5226* (2013.01); *H01L 27/222* (2013.01); *H01L 43/02* (2013.01); *H01L 43/08* (2013.01)

(58) Field of Classification Search
CPC ......... H01L 43/12; H01L 43/02; H01L 43/08; H01L 23/5226; H01L 27/222

USPC .......................................................... 257/427
See application file for complete search history.

(56) References Cited

U.S. PATENT DOCUMENTS

| | | | |
|---|---|---|---|
| 6,674,168 B1 * | 1/2004 | Cooney, III | ...... H01L 21/76801 257/752 |
| 9,595,662 B2 | 3/2017 | Li et al. | |
| 9,865,649 B2 | 1/2018 | Tan et al. | |
| 2004/0087078 A1 | 5/2004 | Agarwala et al. | |
| 2007/0020934 A1 | 1/2007 | Gaidis et al. | |
| 2015/0280112 A1 | 10/2015 | Li et al. | |
| 2016/0329488 A1 * | 11/2016 | Li | ......................... G11C 11/161 |
| 2017/0092693 A1 | 3/2017 | Tan et al. | |

OTHER PUBLICATIONS

Office Action for the related Taiwanese patent application No. 108109352, dated Aug. 7, 2019, 15 pages.

* cited by examiner

*Primary Examiner* — Calvin Y Choi
(74) *Attorney, Agent, or Firm* — Ditthavong & Steiner P.C.

(57) ABSTRACT

Method of forming embedded MRAM in interconnects using a metal hard mask process and the resulting device are provided. Embodiments include forming a first interlayer dielectric (ILD) layer including a first metal (Mx) level; forming a capping layer over the first ILD layer; forming magnetic tunnel junction (MTJ) structures formed in a second ILD over the first capping layer; forming a second metal (Mx+1) level in the second ILD layer; forming a second capping layer over the second ILD layer; and forming a third metal (Mx+2) level in a third ILD layer over the second capping layer.

10 Claims, 8 Drawing Sheets

US 10,483,461 B2

EMBEDDED MRAM IN INTERCONNECTS AND METHOD FOR PRODUCING THE SAME

TECHNICAL FIELD

The present disclosure relates to semiconductor fabrication. In particular, the present disclosure relates to the formation of magnetic random-access memory (MRAM) devices in interconnects.

BACKGROUND

Memory devices such as MRAM have been continuously scaled down in size to accommodate complex device requirements and low power consumption demands. However, the smaller form factor has also increased the complexity of memory device fabrication. Critical dimensions (CD) of memory cells are smaller compared to normal back-end-of-line (BEOL) process variations. Embedded magnetoresistive non-volatile memory (eMRAM) is a film stack designed for both code storage and working memory to enable efficient memory sub-systems that can be power cycled without any energy or performance penalty.

To achieve a desired cell size, the semiconductor industry is pushing to embed a magnetic tunnel junction (MTJ), between metal layers with tight pitch, where there is typically a vertical dimension constraint, for example, a via height of 100 nm for a 90 nm pitch and 75 nm for a 80 nm pitch interconnect. MTJ is composed of at least two ferromagnetic layers separated by an insulating tunnel barrier. A MTJ minimum height including a bottom electrode (BE) is 120 nm. It is not possible to insert MTJ between a metal level Mx and Mx+1.

For tight pitch interconnects less than 100 nm, a titanium nitride (TiN) metal hard mask is used for trench and via patterning. TiN removal is performed with a wet cleaning after trench etching and increases the risk of unwanted interaction with the MTJ.

A need therefore exists for simplified methodology for inserting a MTJ between Mx and Mx+2 levels, and the resulting device.

SUMMARY

An aspect of the present disclosure is a method for embedding a MTJ between Mx and Mx+2 levels, wherein the film stack is the same as a pure logic baseline.

Another aspect of the present disclosure is a device provided with a MTJ hardmask (HM) including a wet clean stop layer. With the wet clean stop layer inserted, the MTJ stack is compatible with small pitch interconnects with TiN metal HM.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a capping layer over an interlayer dielectric (ILD) having a Mx level in a memory region and in a logic region; forming an oxide over the capping layer; forming a via in the oxide and capping layer down to the Mx level in the memory region; filling the via with a metal; forming a magnetic tunnel junction (MTJ) film over the metal filled via in the memory region and over the oxide layer in the logic region; forming a hardmask (HM) over the MTJ film; forming MTJ cells in the memory region and removing the MTJ film in the logic region; and forming a nitride layer over the HM and MTJ in the memory region and over the oxide layer in the logic region.

Aspects of the present disclosure include chemical-mechanical planarization (CMP) of the metal down to the oxide layer prior to forming the MTJ. Other aspects include filling the via with a metal selected from tungsten (W) and a TaN; or filling the via with a metal selected from ruthenium (Ru) or cobalt (Co). Further aspects include forming the HM over the MTJ, wherein the HM further including an inert metal disposed in the HM, the inert metal including ruthenium (Ru), platinum (Pt) or aluminum (Al). Another aspect includes forming the nitride layer over the HM and MTJ in the memory region, wherein the nitride layer includes SiN; and blanket etching the SiN to form spacers on sides of the MTJ in the memory region and remove all oxide from the logic region. Additional aspects include forming an ultralow-k (ULK) dielectric layer over the memory and logic regions and planarizing the ULK dielectric layer. Other aspects include forming a Mx+1 level in the logic region with dual damascene processing; forming a second capping layer over the memory and logic regions; forming a second ULK dielectric layer over the second capping layer; forming trenches is the second ULK dielectric layer in the memory and logic regions; and forming a Mx+2 level in the trenches in the memory and logic regions.

Another aspect of the present disclosure is a device including: a first ILD layer including a Mx level; a capping layer formed over the first ILD layer; MTJ structures formed in a second ILD over the first capping layer; a Mx+1 level formed in the second ILD layer; a second capping layer formed over the second ILD layer; and a Mx+2 level formed in a third ILD layer over the second capping layer.

Aspects of the device include the MTJ is formed in a memory region of the device, a HM is formed over the MTJ, and nitride spacers are formed on sides of the HM and MTJ. Other aspects include metal filled vias connecting the first Mx layer to the MTJ, wherein with the metal filled vias include W and TaN, or the metal filled vias include Ru or Co. Further aspects include oxide spacers formed on sides of the metal filled vias connecting the Mx level to the MTJ. Another aspect includes Cu filled vias (Vx) connect the first Mx layer to the second Mx+1 layer; and Cu filled vias (Vx+1) connect the Mx+1 level to the Mx+2 level. Additional aspects include the first and second capping layers include silicon carbon nitride (SiCN). Other aspects include the HM further including an inert metal disposed over the HM, the inert metal including Ru, platinum (Pt) or aluminum (Al). Other aspects include the Mx, Mx+1, and Mx+2 levels including Cu. Additional aspects include the first, second and third ILD layers including an ultralow-k (ULK) dielectric material.

A further aspect of the present disclosure is a method including: forming a first ILD layer including a Mx level; forming a capping layer over the first ILD layer; forming MTJ structures formed in a second ILD over the first capping layer; forming a Mx+1 level in the second ILD layer; forming a second capping layer over the second ILD layer; and forming a Mx+2 level in a third ILD layer over the second capping layer.

Aspects of the present disclosure include forming the MTJ in a memory region of the device; forming a HM over the MTJ; and forming nitride spacers on sides of the HM and MTJ. Other aspects include forming metal filled vias connecting the Mx level to the MTJ, wherein the metal filled vias include W and TaN, or the metal filled vias include Ru or Co. Further aspects include forming oxide spacers on sides of the metal filled vias connecting the Mx level to the MTJ; forming Cu filled Vx connecting the Mx level to the Mx+1 level; and forming Cu filled Vx+1 connecting the Mx+1 level to the Mx+2 level.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
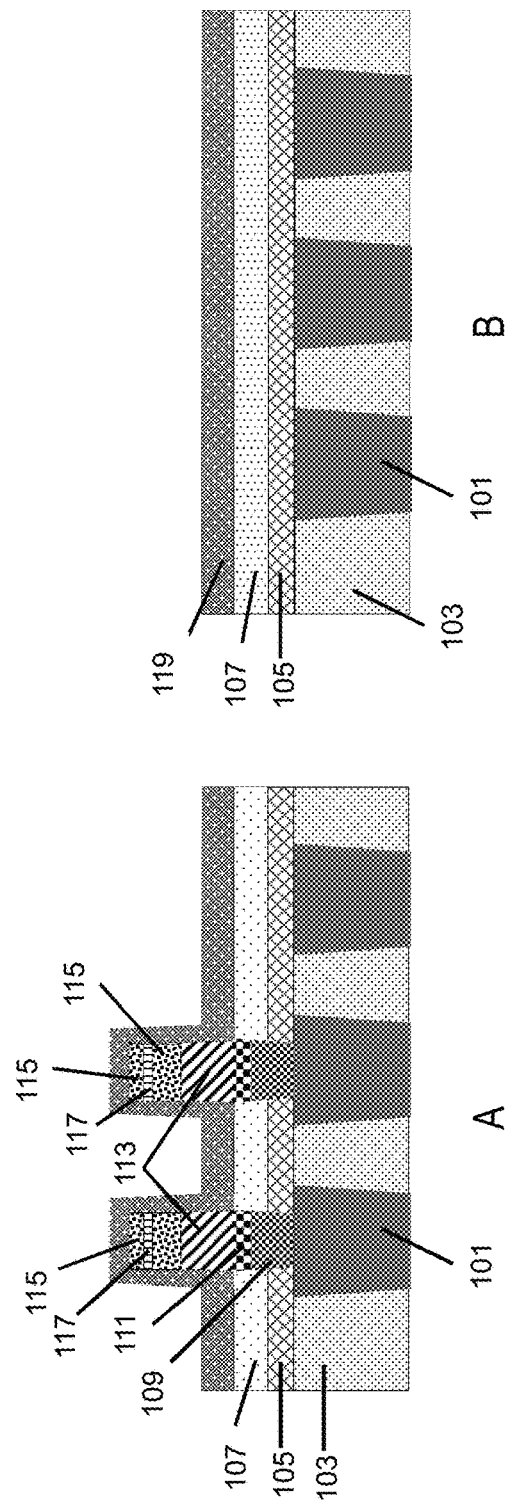
FIGS. 1A through 1G schematically illustrate cross-sectional views of a process flow for inserting MTJ between Mx and Mx+2 levels, in accordance with exemplary embodiments.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of costly solutions for eMRAM in interconnects with tight pitch. The present disclosure provides integration architecture for inserting MTJ between Mx and Mx+2 levels.

Methodology in accordance with embodiments of the present disclosure includes forming a first ILD layer including a Mx level; forming a capping layer over the first ILD layer; forming MTJ structures formed in a second ILD over the first capping layer; forming a Mx+1 level in the second ILD layer; forming a second capping layer over the second ILD layer; and forming a Mx+2 level in a third ILD layer over the second capping layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1G schematically illustrate cross-sectional views of a process flow for inserting MTJ between Mx and Mx+2 levels. A Mx level 101 is formed in ILD 103. A low dielectric constant (low-k) material such as silicon dioxide ($SiO_2$) or any similar ILD material with a dielectric constant value of <4.5 can be used, or an ultra low-k (ULK) material such as SiCOH or any similar ILD material with a dielectric constant value of <2.5 can be used. The metal in the Mx level is formed of Cu and formed in the memory region A and the logic region B. An Nblok capping layer 105, such as SiCN is formed over the Mx 101 and ILD 103 in the memory region A, such as MRAM, and an adjacent logic region B. The Nblok capping layer 105 has a thickness of 20 to 50 nm.

An oxide layer 107 is also be formed, e.g., of silicon oxide, over the capping layer 105. The oxide layer has a thickness of 20 to 60 nm. Vias (not shown for illustrative convenience) are then formed through the oxide layer 111 and the capping layer 109 in the memory region 103 down to the Mx level 103. Next, the vias are filled with a first conductive metal layer 109, e.g., W, and a second conductive metal layer 111, e.g., TaN, formed over the conductive metal layer 109 in the memory region A. The first conductive metal layer 109 can be formed with a thickness of 30 to 80 nm. The second conductive metal layer 111 can be formed with a thickness of 20 to 40 nm. A barrier liner (not shown for illustrative convenience) can be formed in the via prior to filling with the conductive metals 109 and 111. The conductive metals 109 and 111 together form the BE. The BE width is comparable or smaller in size than the MTJ. Excess conductive metal 111 can be removed by way of CMP such that the upper surface of the second conductive layer 111 is coplanar with the oxide 107 in the memory region A.

The MTJ structures 113, which are pillars or cells for the MRAM, are formed by depositing forming a MTJ film over the metal filled via in the memory region A and over the oxide layer 107 in the logic region B. The MTJ film includes at least two ferromagnetic layers separated by an insulating tunnel barrier. No MTJ dummy structures are required to be formed in the logic region B, which would impact the device resistance capacitance (RC).

An electrically conductive HM 115 is formed over the deposited MTJ film and the HM 115 includes a wet etch stop layer 117, e.g., Ru, Al or other material resistant to TiN cleaning. The wet etch stop layer 117 is formed to a thickness of 10 to 30 nm. The MTJ structures (i.e., cells or pillars) 113 are formed in the memory region A, by way of lithography and etching through the HM 115. The MTJ film is removed in the logic region B. A nitride encapsulation layer 119 is formed over the HM 115, MTJ structures 113 and oxide layer 107 to a thickness of 10 to 30 nm in the memory region A and logic region B. The nitride layer 119 can be formed of SiN.

Figure 1B:
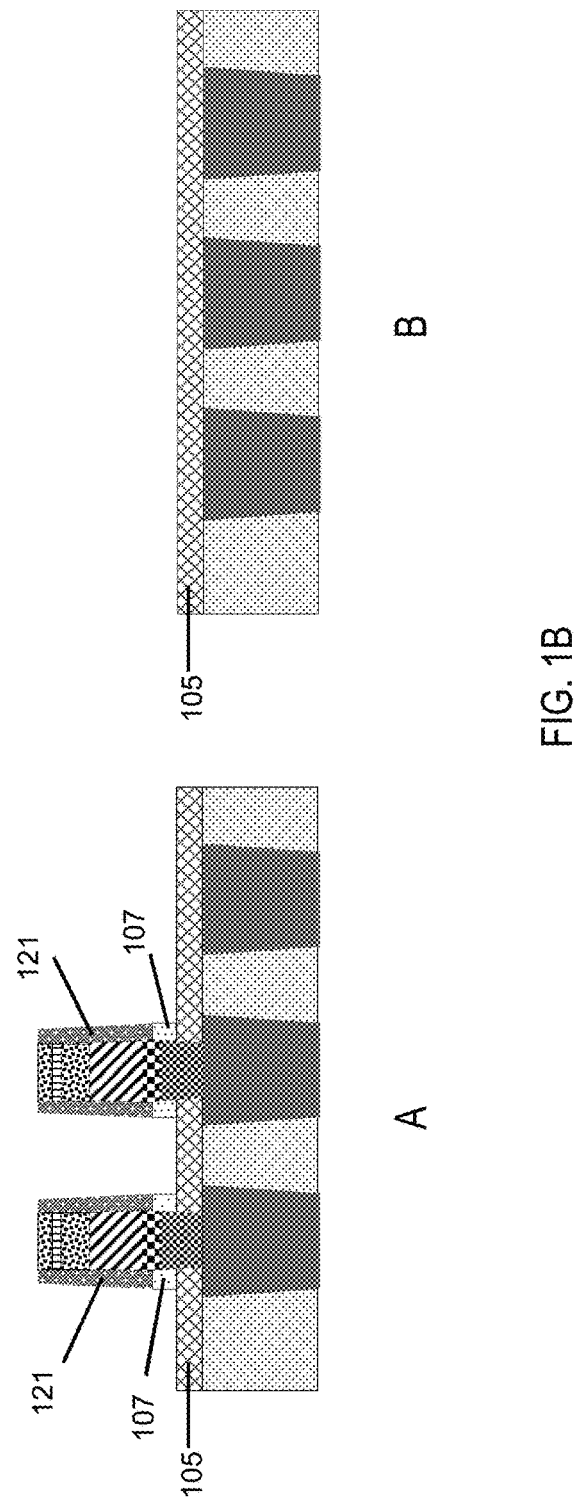

In FIG. 1B, a spacer etching step, such as a blanket etch, is performed to form sidewalls 121. The etching is highly selective to the capping layer 105 such that all of the oxide layer is removed from the logic region B. Oxide 107 remains under the sidewalls 121 and over the capping layer 105 in the memory region B.

Figure 1C:
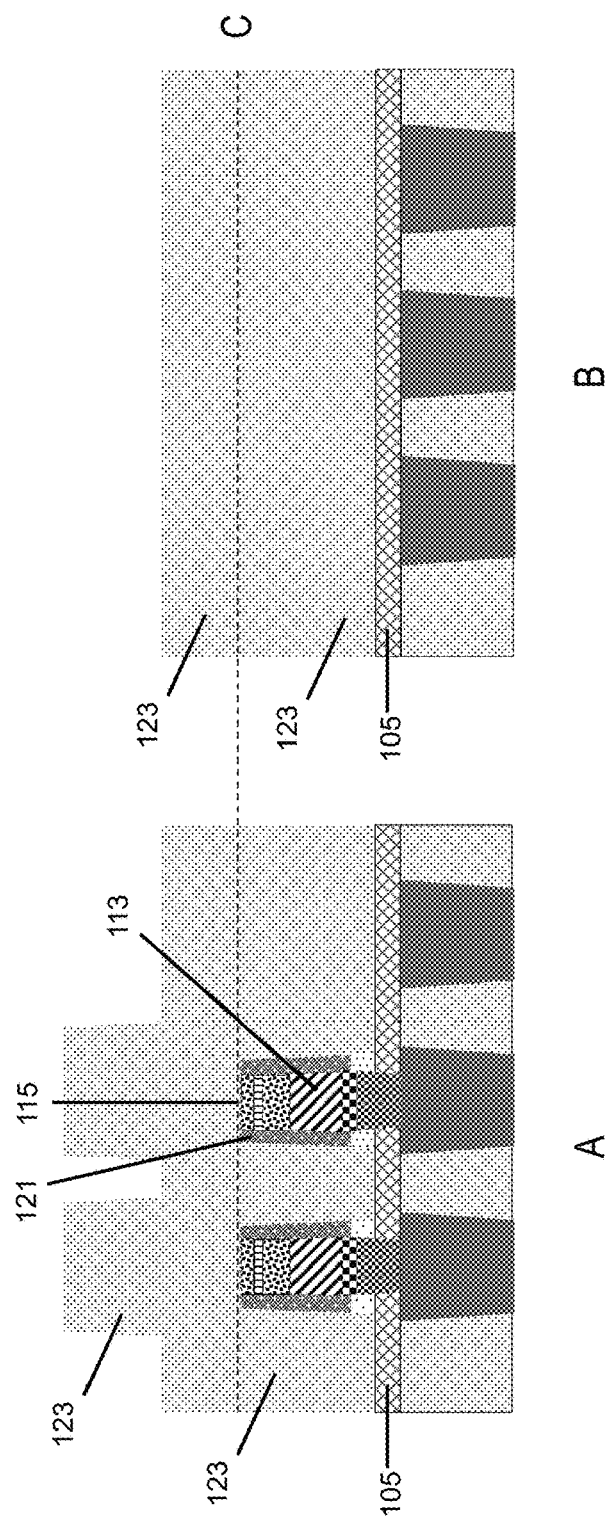
Figure 1D:
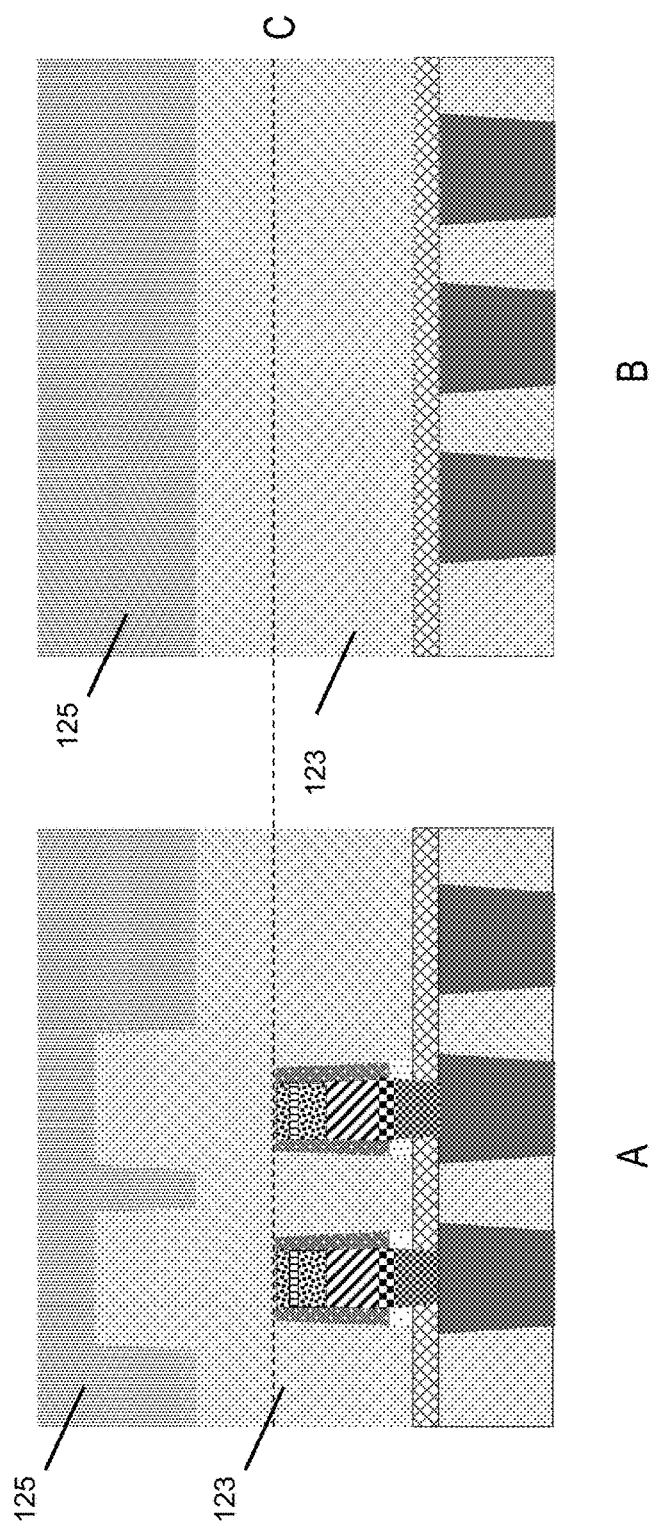

In FIG. 1C, a ULK deposition and planarization is performed as a first option for the planarization. The second option is depicted in FIG. 1D. In FIG. 1C, the ULK 123 is deposited over the MTJ structures 113 and capping layer 105 in the memory region A, and over the capping layer 105 in the logic region B. A CMP step planarizes the ULK 123 down to upper surfaces of the HM 115 and sidewalls 121 in the memory region A and removes excess ULK layer 123 in the logic region B, as indicated by dotted line C. The final thickness of the ULK 123 with this first option is 100 to 200 nm.

In FIG. 1D, a ULK 123 can be deposited followed by a sacrificial organic coating 125 formed over the ULK 123. A blanket etch removes the sacrificial organic coating 125 and a portion of the ULK 123 in the memory and logic regions, down to dotted line C. A blanket etch ca be used to remove the sacrificial organic coating 125 and a portion of the ULK 123. The final thickness of the ULK 123 with this second option is 100 to 200 nm.

Figure 1E:
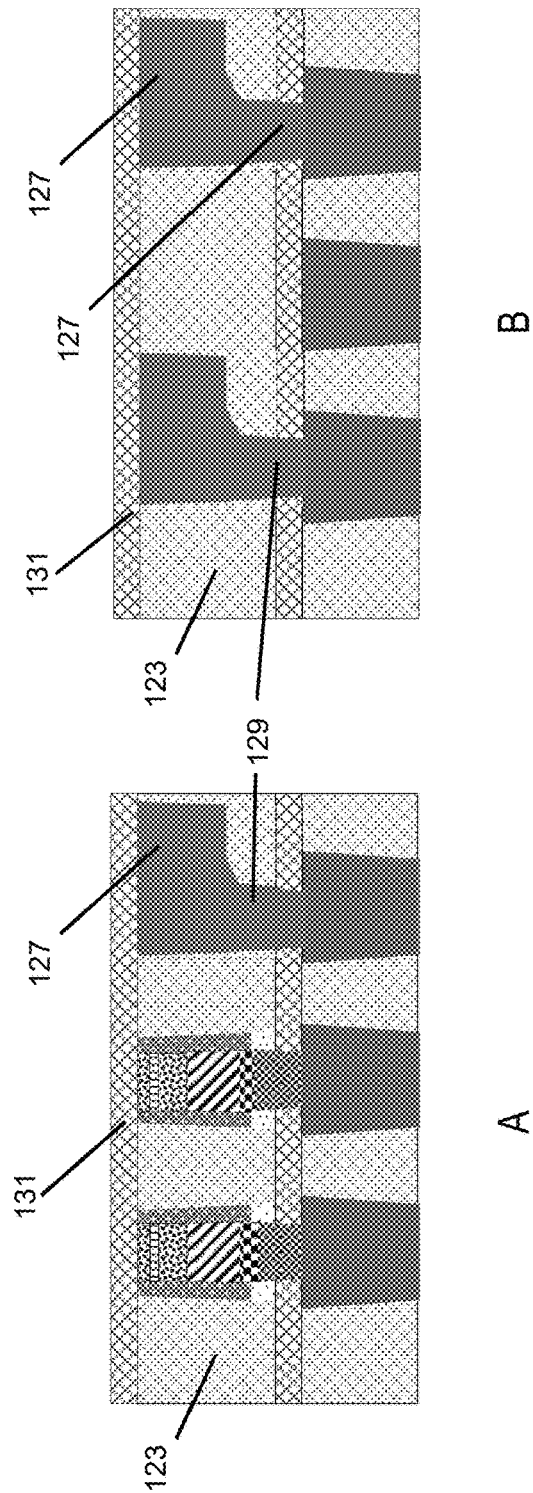

In FIG. 1E, a dual damascene process with TiN metal HM (not shown for illustrative convenience) is performed to form Mx+1 level 127 and vias Vx 129 in the ULK layer 123. The Mx+1 level 127 and vias (Vx) 129 are formed in the memory region A and logic region B. In other examples, the Mx+1 level and Vx can be formed just in the logic region B. As shown in FIG. 1E, a second capping layer 131, e.g., an Nblok, is formed over the ULK layer 123.

Figure 1F:
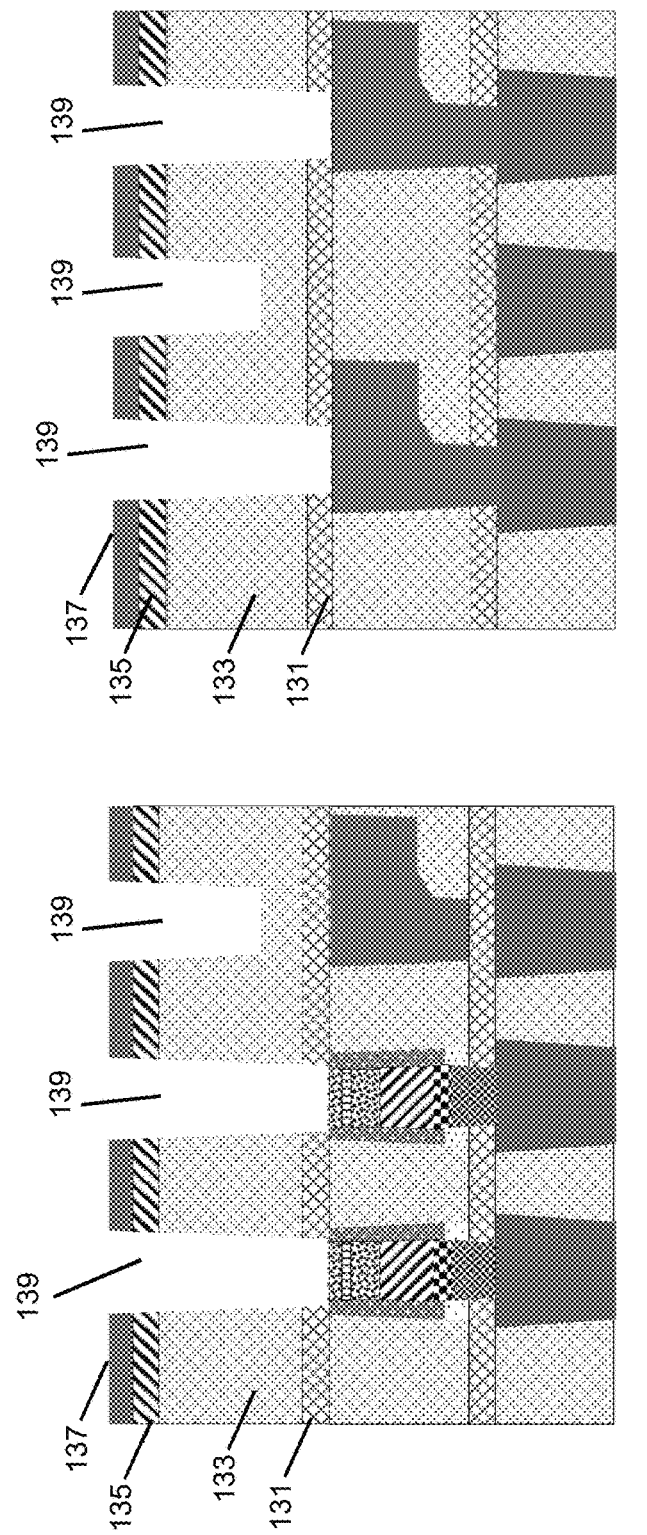

In FIG. 1F, a ULK layer 133 is deposited over the second capping layer 131 in the memory region A and logic region B. An oxide layer 135 is formed over the ULK layer 133 and a metal HM 137, e.g., TiN, is formed over oxide layer 135. A dual damascene process is performed to form trenches for Mx+2 level and vias Vx+1 129 in the ULK layer 133.

Figure 1G:
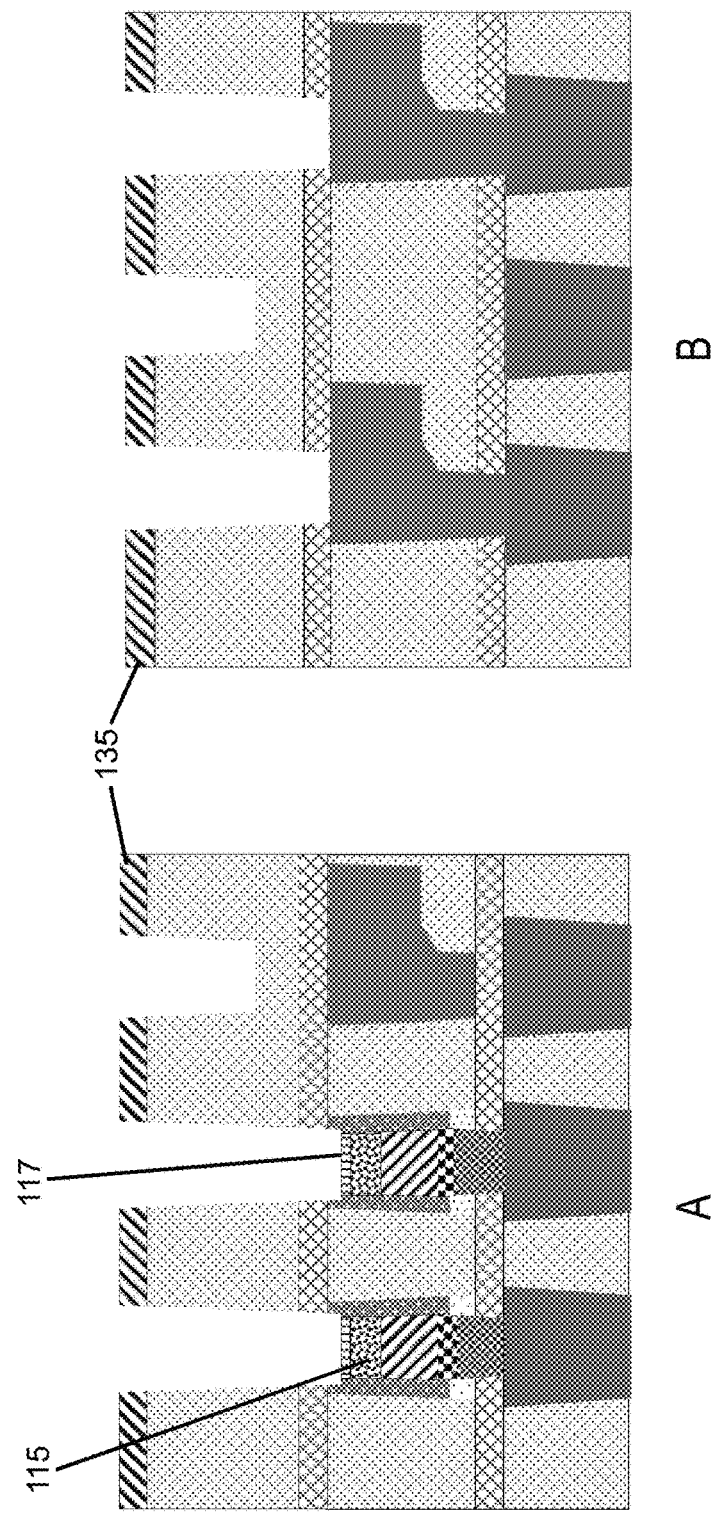

In FIG. 1G, the metal HM 137 is removed and with this removal the upper portion of HM 115 is also removed down to the wet etch stop layer 117 in the memory region A. In FIG. 1H the trenches 1349 can be filled with Cu to form the Mx+2 141 and Vx+1 143 in the memory region A and logic region B (logic region B not shown for illustrative convenience). A barrier or seed liner (not shown for illustrative convenience) can be formed prior to Cu deposition.

Figure 1I:
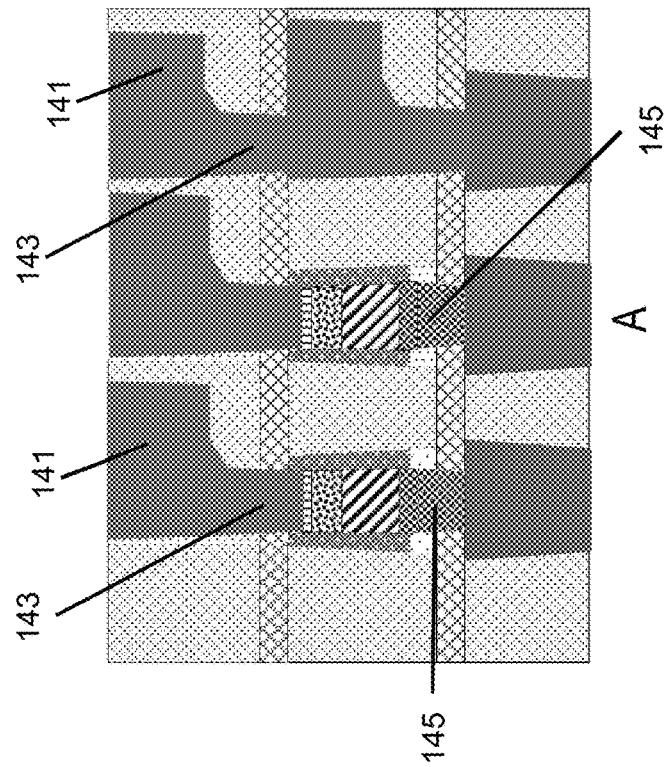
FIG. 1I schematically illustrates a cross-sectional view of a device including a BE with Co or Ru fill, in accordance with another exemplary embodiment.
Figure 1H:
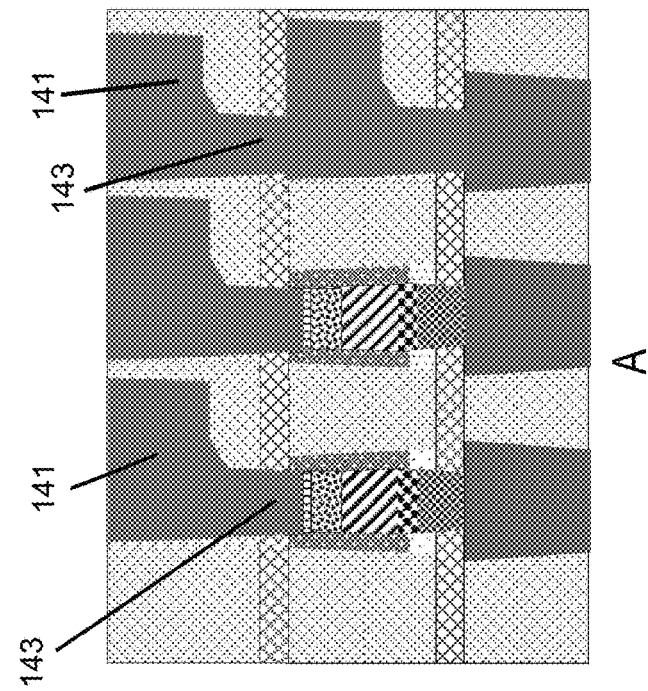
FIG. 1H schematically illustrates a cross-sectional view of a device including a BE formed with recessed W and TaN, in accordance with an exemplary embodiment.

FIG. 1I schematically illustrates a cross-sectional view of a device including a BE 145 with Co or Ru fill, rather than the W/TaN BE of the FIG. 1H. The Co or Ru fill is a more simplified process than the W/TaN BE. The Co or Ru fill can be used in advanced technology nodes such as 7 nm and below. The remaining process steps are substantially the same as those used to produce the device in FIG. 1H.

The embodiments of the present disclosure can achieve several technical effects including forming a MTJ between Mx and Mx+2. The wet stop etch layer allows the MTJ to be compatible with small pitch interconnects using a TiN HM. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including MRAM and eMRAM.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a first interlayer dielectric (ILD) layer including a first metal (Mx) level;
   a capping layer formed over the first ILD layer;
   magnetic tunnel junction (MTJ) structures formed in a second ILD over the first capping layer;
   a second metal (Mx+1) level formed in the second ILD layer;
   a second capping layer formed over the second ILD layer;
   a third metal (Mx+2) level formed in a third ILD layer over the second capping layer;
   oxide spacers formed on sides of metal filled vias, the metal filled vias connecting the Mx level to the MTJ;
   copper (Cu) filled vias (Vx) connecting the Mx level to the Mx+1 level; and
   Cu filled vias (Vx+1) connecting the Mx+1 level to the Mx+2 level.

2. The device according to claim 1, wherein:
   the MTJ is formed in a memory region of the device,
   a hardmask (HM) is formed over the MTJ, and
   nitride spacers are formed on sides of the HM and MTJ.

3. The device according to claim 2,
   wherein with the metal filled vias comprise tungsten (W) and tantalum nitride (TaN), or the metal filled vias comprise ruthenium (Ru) or cobalt (Co).

4. The device according to claim 1, wherein the first and second capping layers comprise silicon carbon nitride (SiCN).

5. The device according to claim 1, wherein the wherein the HM further comprises an inert metal disposed over the HM, the inert metal comprising ruthenium (Ru), platinum (Pt) or aluminum (Al).

6. The device according to claim 1, wherein the Mx, Mx+1, and Mx+2 levels comprise Cu.

7. The device according to claim 1, wherein the first, second and third ILD layers comprise an ultralow-k (ULK) dielectric material.

8. A method comprising:
   forming a first interlayer dielectric (ILD) layer including a first metal (Mx) level;
   forming a capping layer over the first ILD layer;
   forming magnetic tunnel junction (MTJ) structures formed in a second ILD over the first capping layer;
   forming a second metal (Mx+1) level in the second ILD layer;
   forming a second capping layer over the second ILD layer;
   forming a third metal (Mx+2) level in a third ILD layer over the second capping layer;
   forming oxide spacers on sides of metal filled vias, the metal filled vias connecting the Mx level to the MTJ;
   forming copper (Cu) filled vias (Vx) connecting the Mx level to the Mx+1 level; and
   forming Cu filled vias (Vx+1) connecting the Mx+1 level to the Mx+2 level.

9. The method according to claim 8, further comprising:
   forming the MTJ in a memory region of the device;
   forming a hardmask (HM) over the MTJ; and
   forming nitride spacers on sides of the HM and MTJ.

10. The method according to claim 8, wherein with the metal filled vias comprise tungsten (W) and a tantalum nitride (TaN), or the metal filled vias comprise ruthenium (Ru) or cobalt (Co).

\* \* \* \* \*